(12) United States Patent
Araki et al.

(10) Patent No.: US 11,664,045 B1
(45) Date of Patent: May 30, 2023

(54) MANUFACTURING METHOD FOR MAGNETORESISTIVE ELEMENT

(71) Applicants: Hironori Araki, Milpitas, CA (US); Yoshitaka Sasaki, Los Gatos, CA (US); Yoji Nomura, Milpitas, CA (US); Shigeki Tanemura, Milpitas, CA (US); Yukinori Ikegawa, Milpitas, CA (US)

(72) Inventors: Hironori Araki, Milpitas, CA (US); Yoshitaka Sasaki, Los Gatos, CA (US); Yoji Nomura, Milpitas, CA (US); Shigeki Tanemura, Milpitas, CA (US); Yukinori Ikegawa, Milpitas, CA (US)

(73) Assignee: HEADWAY TECHNOLOGIES, INC., Milpitas, CA (US)

( * ) Notice: Subject to any disclaimer, the term of this patent is extended or adjusted under 35 U.S.C. 154(b) by 0 days.

(21) Appl. No.: 17/677,528

(22) Filed: Feb. 22, 2022

(51) Int. Cl.
*G11B 5/31* (2006.01)
*G11B 5/39* (2006.01)
*G11B 5/127* (2006.01)

(52) U.S. Cl.
CPC .......... *G11B 5/3163* (2013.01); *G11B 5/1278* (2013.01); *G11B 5/3912* (2013.01); *H10N 50/01* (2023.02); *H10N 50/10* (2023.02); *H10N 50/85* (2023.02)

(58) Field of Classification Search
None
See application file for complete search history.

(56) References Cited

U.S. PATENT DOCUMENTS

| | | | |
|---|---|---|---|
| 8,225,489 B2 | 7/2012 | Miyauchi et al. | |
| 2006/0156537 A1* | 7/2006 | Druist | G11B 5/3163 29/603.12 |
| 2006/0291097 A1* | 12/2006 | Honda | G11B 5/3163 |
| 2008/0026326 A1* | 1/2008 | Akie | G11B 5/3932 430/311 |
| 2011/0232079 A1* | 9/2011 | Miyauchi | B82Y 40/00 29/603.07 |
| 2012/0125884 A1* | 5/2012 | Chung | B82Y 25/00 216/22 |
| 2012/0187079 A1* | 7/2012 | Mashima | G01R 33/098 216/22 |
| 2014/0043713 A1 | 2/2014 | Isowaki et al. | |

FOREIGN PATENT DOCUMENTS

| | | | | |
|---|---|---|---|---|
| CN | 100373451 C | * | 3/2008 | ........... G11B 5/3163 |
| GB | 2427504 A | * | 12/2006 | ............. B82Y 10/00 |
| JP | 2004253437 A | * | 9/2004 | ............. B82Y 10/00 |
| JP | 2008004223 A | * | 1/2008 | ........... G11B 5/3163 |
| JP | 2009301661 A | * | 12/2009 | ............. B82Y 25/00 |

* cited by examiner

*Primary Examiner* — William J Klimowicz
(74) *Attorney, Agent, or Firm* — Oliff PLC (57) ABSTRACT

A manufacturing method for a magnetoresistive element includes: a step of forming a stack; a step of forming an insulating film to cover the stack; a step of forming an initial magnetic layer to cover the stack and the insulating film so that a thickness of the initial magnetic layer in a first direction is greater than a thickness of the stack in the first direction; a step of forming an organic material film on the initial magnetic layer; and an etching step of etching a part of the initial magnetic layer and the organic material film by ion beam etching so that the initial magnetic layer becomes a pair of magnetic layers.

7 Claims, 10 Drawing Sheets

MANUFACTURING METHOD FOR MAGNETORESISTIVE ELEMENT

BACKGROUND OF THE INVENTION

1. Field of the Invention

The present invention relates to a manufacturing method for a magnetoresistive element that is for use in, for example, a thin-film magnetic head.

2. Description of the Related Art

With recent increases in recording density of magnetic recording devices such as magnetic disk drives, there has been demand for improved performance of thin-film magnetic heads and recording media. Among the thin-film magnetic heads, a composite thin-film magnetic head has been used widely. The composite thin-film magnetic head has such a structure that a read head unit including a magnetoresistive element (hereinafter, also referred to as MR element) for reading and a write head unit including an induction-type electromagnetic transducer for writing are stacked on a substrate.

Examples of MR elements include a giant magnetoresistive (GMR) element utilizing a giant magnetoresistive effect and a tunneling magnetoresistive (TMR) element utilizing a tunneling magnetoresistive effect.

Read heads are required to have characteristics of high sensitivity and high output. As the read heads that satisfy such requirements, those incorporating spin-valve GMR elements or TMR elements have been mass-produced.

Spin-valve GMR elements and TMR elements each typically include a free layer, a pinned layer, a spacer layer disposed between the free layer and the pinned layer, and an antiferromagnetic layer disposed on a side of the pinned layer opposite from the spacer layer. The free layer is a ferromagnetic layer whose direction of magnetization changes in response to a signal magnetic field. The pinned layer is a ferromagnetic layer whose direction of magnetization is pinned. The antiferromagnetic layer is a layer that pins the direction of magnetization of the pinned layer by means of exchange coupling with the pinned layer. For spin-valve GMR elements, the spacer layer is a nonmagnetic conductive layer. For TMR elements, the spacer layer is a tunnel barrier layer.

A read head including a pair of magnetic layers sandwiching an MR element therebetween has been known. An example of such a read head is disclosed in US 2014/0043713 A1.

In the read head including the MR element and the pair of magnetic layers, the top surfaces of the pair of magnetic layers being even with each other is desirable. An example of means for planarization is chemical mechanical polishing (hereinafter, may be referred to as CMP). However, the CMP-based planarization is not sufficient to accurately make the top surfaces of the pair of magnetic layers even with each other.

SUMMARY OF THE INVENTION

An object of the present invention is to provide a manufacturing method for a magnetoresistive element including a stack serving as a main body of the magnetoresistive element and a pair of magnetic layers, wherein the top surfaces of the pair of magnetic layers can be accurately made even with each other.

A magnetoresistive element manufactured by a manufacturing method according to the present invention includes: a stack that serves as a main body of the magnetoresistive element, the stack including a plurality of layers stacked in a first direction and having a predetermined width; a pair of magnetic layers located on both sides of the stack in a second direction orthogonal to the first direction; and an insulating film interposed between the stack and the pair of magnetic layers.

The manufacturing method for the magnetoresistive element according to the present invention includes: a step of forming the stack; a step of forming the insulating film to cover the stack; a step of forming an initial magnetic layer to cover the stack and the insulating film so that a thickness of the initial magnetic layer in the first direction is greater than a thickness of the stack in the first direction; a step of forming an organic material film on the initial magnetic layer; and an etching step of etching a part of the initial magnetic layer and the organic material film by ion beam etching so that the initial magnetic layer becomes the pair of magnetic layers.

In the manufacturing method for the magnetoresistive element according to the present invention, the step of forming the organic material film may include a step of applying a fluid organic material, and a step of heating the organic material to cure. In such a case, a maximum thickness of the organic material in the first direction may be greater than a difference in surface level of the initial magnetic layer in the first direction, where the initial magnetic layer may have the difference in surface level near the stack.

In the manufacturing method for the magnetoresistive element according to the present invention, an angle that a direction of travel of an ion beam forms with the first direction in the etching step may fall within a range of 30° to 40°.

In the manufacturing method for the magnetoresistive element according to the present invention, the stack may include a free layer, a pinned layer, and a tunnel barrier layer located between the free layer and the pinned layer.

In the manufacturing method for the magnetoresistive element according to the present invention, the insulating film may be formed of MgO.

The magnetoresistive element manufactured by the manufacturing method according to the present invention may be provided in a magnetic head for perpendicular magnetic recording.

In the manufacturing method for the magnetoresistive element according to the present invention, a part of the initial magnetic layer and the organic material film are etched by ion beam etching. According to the present invention, the top surfaces of the pair of magnetic layers can thereby be accurately made even with each other.

Other and further objects, features and advantages of the present invention will appear more fully from the following description.

DETAILED DESCRIPTION OF THE PREFERRED EMBODIMENTS

Figure 1:
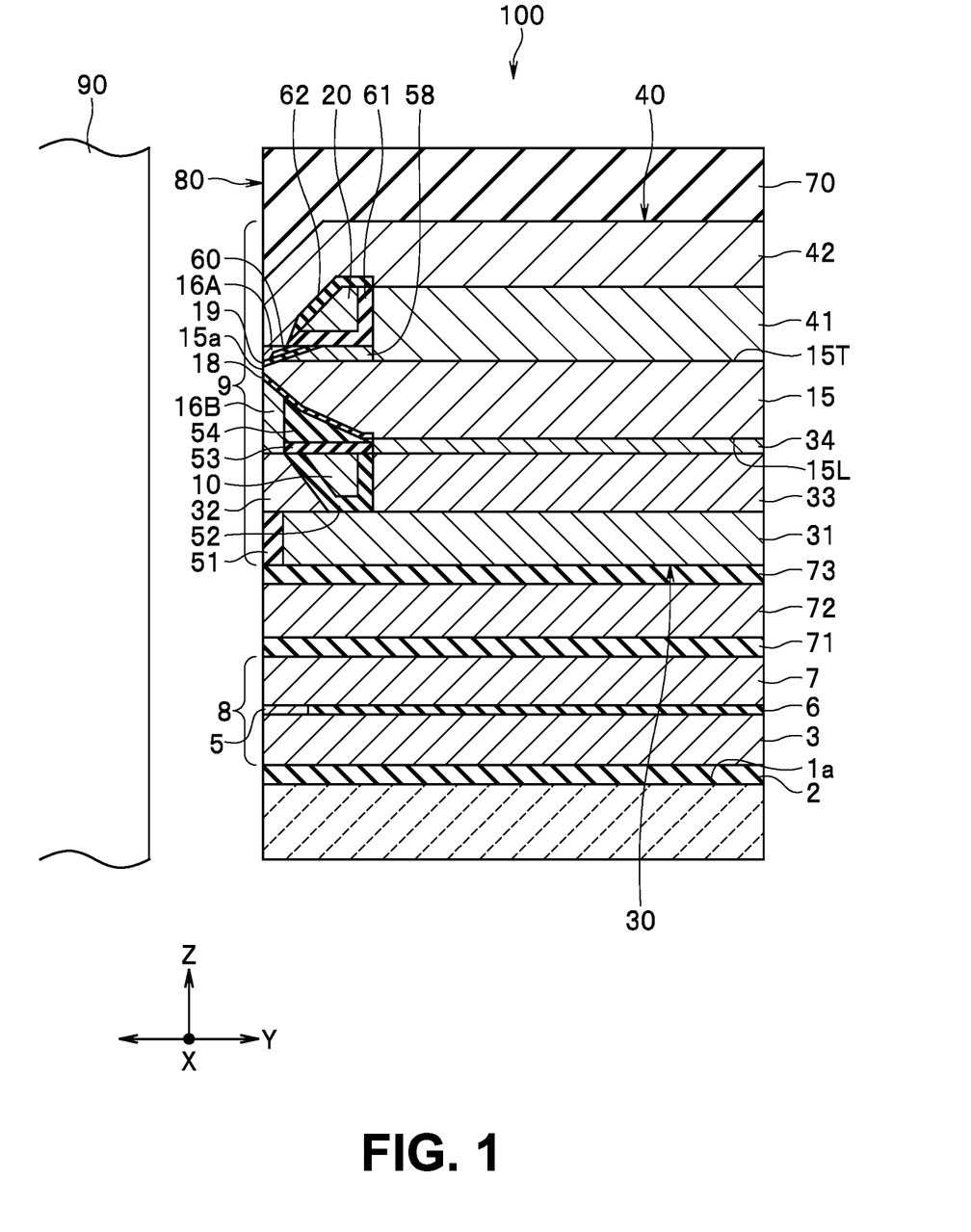
FIG. 1 is a cross-sectional view showing a configuration of a magnetic head according to an embodiment of the invention.
Figure 2:
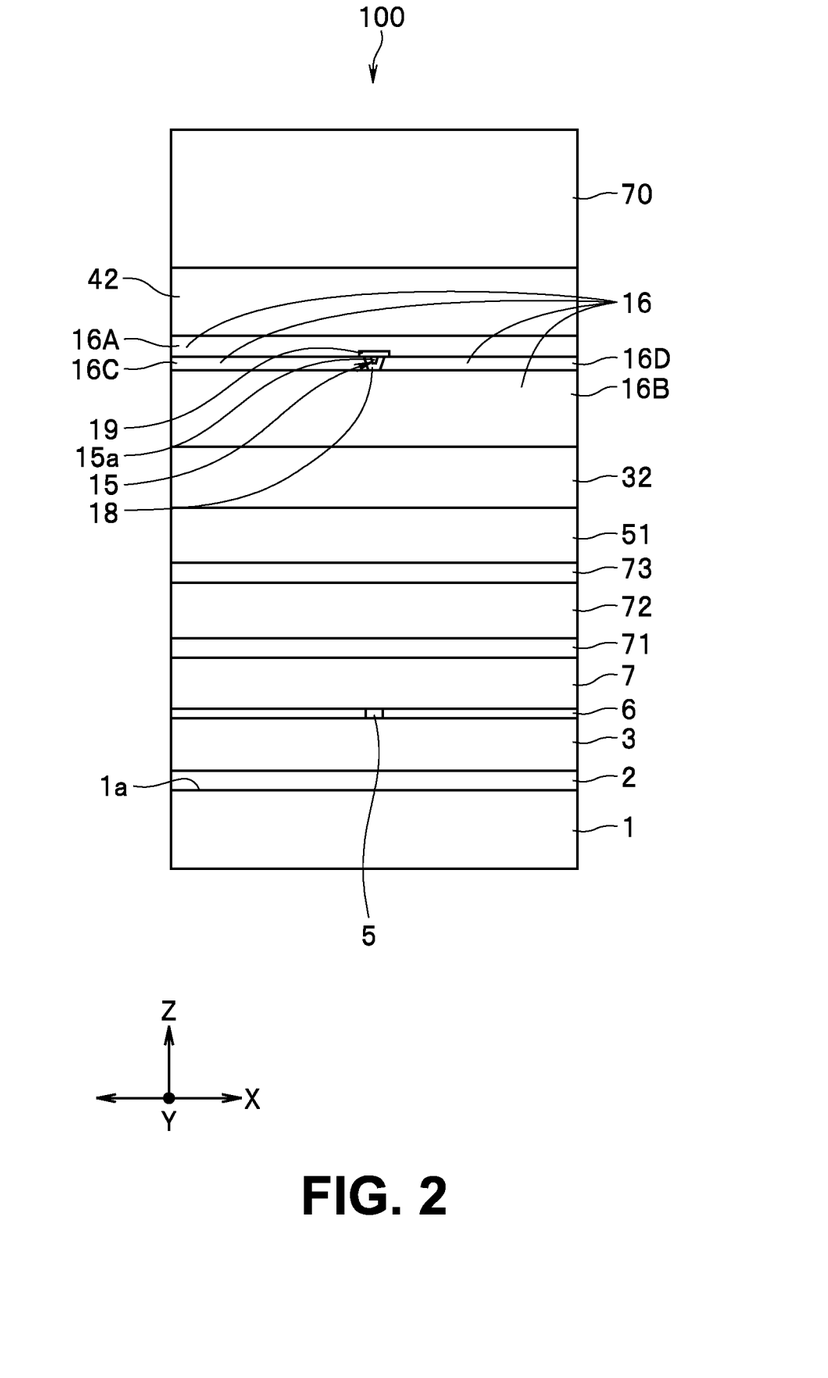
FIG. 2 is a front view showing a medium facing surface of the magnetic head according to the embodiment of the invention.

An embodiment of the present invention will now be described in detail with reference to the drawings. First, reference is made to FIG. 1 and FIG. 2 to describe a configuration of a magnetic head according to a first embodiment of the invention. FIG. 1 is a cross-sectional view showing the configuration of the magnetic head. FIG. 2 is a front view showing the medium facing surface of the magnetic head.

The magnetic head 100 according to the present embodiment is a magnetic head for perpendicular magnetic recording. The magnetic head 100 according to the present embodiment is for use in, for example, a magnetic disk drive, and is incorporated in a slider configured to fly over the surface of a rotating recording medium 90. The slider has a medium facing surface 80 configured to face the recording medium 90. The medium facing surface 80 has an air inflow end (a leading end) and an air outflow end (a trailing end). An airflow that comes from the leading end into the space between the medium facing surface 80 and the recording medium 90 causes the slider to slightly fly over the surface of the recording medium 90.

X, Y, and Z directions are defined here as follows. The X direction is the direction across the tracks of the recording medium 90, i.e., the track width direction. The Y direction is a direction perpendicular to the medium facing surface 80. The Z direction is the direction of travel of the recording medium 90 as viewed from the slider. The X, Y, and Z directions are orthogonal to one another.

As shown in FIG. 1, the magnetic head 100 has the medium facing surface 80. As shown in FIGS. 1 and 2, the magnetic head 100 includes: a substrate 1 formed of a ceramic material such as aluminum oxide-titanium carbide ($Al_2O_3$-TiC) and having a top surface 1a; an insulating layer 2 formed of an insulating material such as alumina ($Al_2O_3$) and disposed on the top surface 1a of the substrate 1; a first read shield layer 3 formed of a magnetic material and disposed on the insulating layer 2; a magnetoresistive (MR) element 5 as a read element disposed on the first read shield layer 3; an insulating layer 6 formed of an insulating material and disposed around the MR element 5; and a second read shield layer 7 formed of a magnetic material and disposed on the MR element 5 and the insulating layer 6.

An end of the MR element 5 is located in the medium facing surface 80. The MR element 5 may be an element formed of a magneto-sensitive film that exhibits a magnetoresistive effect, such as an anisotropic magnetoresistive (AMR) element, a giant magnetoresistive (GMR) element, or a tunneling magnetoresistive (TMR) element. In particular, in the present embodiment, the MR element 5 is a TMR element or a current perpendicular to plane (CPP) GMR element.

The parts from the first read shield layer 3 to the second read shield layer 7 constitute a read head unit 8. The magnetic head 100 further includes: a nonmagnetic layer 71 formed of a nonmagnetic material and disposed on the second read shield layer 7; a middle shield layer 72 formed of a magnetic material and disposed on the nonmagnetic layer 71; a nonmagnetic layer 73 formed of a nonmagnetic material and disposed on the middle shield layer 72; and a write head unit 9 disposed on the nonmagnetic layer 73. The middle shield layer 72 has the function of shielding the MR element 5 from magnetic fields generated in the write head unit 9. The nonmagnetic layers 71 and 73 are formed of alumina, for example.

The write head unit 9 includes a coil, a main pole 15, and a write shield 16. The coil generates a magnetic field corresponding to data to be written on the recording medium 90. The coil includes an upper coil portion 20 and a lower coil portion 10. Each of the upper coil portion 20 and the lower coil portion 10 is formed of a conductive material such as copper. The upper coil portion 20 and the lower coil portion 10 are connected in series or in parallel. The main pole 15 has an end face 15a located in the medium facing surface 80, and is configured to pass a magnetic flux corresponding to the magnetic field generated by the coil and to generate a write magnetic field for writing data on the recording medium 90 by means of a perpendicular magnetic recording system. FIG. 1 shows a cross section that intersects the end face 15a of the main pole 15 and that is perpendicular to the medium facing surface 80 and to the top surface 1a of the substrate 1.

As shown in FIG. 2, the write shield 16 includes a trailing shield 16A, a leading shield 16B, and two side shields 16C and 16D. The trailing shield 16A is located forward relative to the main pole 15 in the direction of travel of the recording medium 90 (the Z direction). Being located forward relative to the main pole 15 in the direction of travel of the recording medium 90 refers to being located farther from the top surface 1a of the substrate 1 than the main pole 15. The leading shield 16B is located backward relative to the main pole 15 in the direction of travel of the recording medium 90. Being located backward relative to the main pole 15 in the direction of travel of the recording medium 90 refers to being located closer to the top surface 1a of the substrate 1 than the main pole 15. The side shields 16C and 16D are located farther from the top surface 1a of the substrate 1 than the leading shield 16B, opposed to each other in the track width direction (the X direction) with the main pole 15 therebetween, and magnetically couple the trailing shield 16A and the leading shield 16B.

The write shield 16 is formed of a magnetic material. For example, CoFeN, CoNiFe, FeNi, or CoFe can be used as the material of the write shield 16.

The write head unit 9 further includes an upper return path section 40 and a lower return path section 30. Both the upper return path section 40 and the lower return path section 30 are formed of a magnetic material. For example, CoFeN, CoNiFe, FeNi, or CoFe can be used as the material of the upper return path section 40 and the lower return path section 30.

The upper return path section 40 is located forward relative to the main pole 15 in the direction of travel of the recording medium 90, and connects part of the main pole 15 located away from the medium facing surface 80 to the write shield 16, thereby magnetically coupling the main pole 15 to the write shield 16. The upper return path section 40 and the main pole 15 define an upper space for a portion of the coil to pass through.

The lower return path section 30 is located backward relative to the main pole 15 in the direction of travel of the recording medium 90, and connects part of the main pole 15 located away from the medium facing surface 80 to the write shield 16, thereby magnetically coupling the main pole 15 to the write shield 16. The lower return path section 30 and the main pole 15 define a lower space for a portion of the coil to pass through.

The lower return path section 30 includes coupling sections 31, 32, 33, and 34. The coupling section 31 is disposed on the nonmagnetic layer 73. The coupling sections 32 and 33 are both disposed on the coupling section 31. The coupling section 32 is located near the medium facing surface 80. The coupling section 33 is located farther from the medium facing surface 80 than the coupling section 32. The coupling section 31 has an end face located at a distance from the medium facing surface 80. The coupling section 32 has an end face located in the medium facing surface 80.

Although not shown in the drawing, the lower coil portion 10 is wound around the coupling section 33. The write head unit 9 further includes: an insulating layer 51 formed of an insulating material, lying on the nonmagnetic layer 73 and surrounding the coupling section 31; an insulating film 52 formed of an insulating material and isolating the lower coil portion 10 from the coupling sections 31 to 33; and a not-shown insulating layer formed of an insulating material and disposed around the lower coil portion 10 and the coupling section 32. The top surfaces of the lower coil portion 10, the coupling sections 32 and 33, the insulating film 52 and the not-shown insulating layer are even with each other. The insulating layer 51, the insulating film 52, and the not-shown insulating layer are formed of alumina, for example.

The leading shield 16B lies on the coupling section 32. The coupling section 34 lies on the coupling section 33. The write head unit 9 further includes an insulating layer 53 formed of an insulating material. The insulating layer 53 lies on top surfaces of the lower coil portion 10, the insulating film 52, and the not-shown insulating layer. The insulating layer 53 is formed of alumina, for example.

The write head unit 9 further includes a nonmagnetic layer 54 formed of a nonmagnetic material. The nonmagnetic layer 54 lies on the insulating layer 53 and surrounds the leading shield 16B and the coupling section 34. The nonmagnetic layer 54 is formed of alumina or silicon oxide ($SiO_2$), for example.

The side shields 16C and 16D are disposed on the leading shield 16B. The main pole 15 has the end face 15a, and also a top surface 15T (see FIG. 1) farthest from the top surface 1a of the substrate 1, a bottom end 15L (see FIG. 1) opposite to the top surface 15T, and a first side surface and a second side surface (see FIG. 2) opposite to each other in the track width direction (the X direction). As shown in FIG. 2, the side shield 16C has a first sidewall opposed to a portion of the first side surface of the main pole 15 located near the medium facing surface 80. The side shield 16D has a second sidewall opposed to a portion of the second side surface of the main pole 15 located near the medium facing surface 80.

The write head unit 9 further includes a first gap layer 18 formed of a nonmagnetic material. The first gap layer 18 is disposed to extend along the first and second sidewalls of the side shields 16C and 16D, the top surface of the leading shield 16B and the top surface of the nonmagnetic layer 55. The nonmagnetic material used to form the first gap layer 18 may be an insulating material such as alumina, for example.

As shown in FIG. 1, the first gap layer 18 is interposed between a portion of the bottom end 15L of the main pole 15 and the top surfaces of the leading shield 16B and the nonmagnetic layer 54. As shown in FIG. 2, the first gap layer 18 is interposed also between the first side surface of the main pole 15 and the first sidewall of the side shield 16C, and between the second side surface of the main pole 15 and the second sidewall of the side shield 16D.

At a location apart from the medium facing surface 80, the bottom end 15L of the main pole 15 is in contact with the top surface of the coupling section 34. The main pole 15 is formed of a ferromagnetic material containing one or more elements selected from Ni, Fe, and Co, such as FeNi, CoNiFe, or CoFe.

The magnetic head further includes a first nonmagnetic layer (not shown) formed of a nonmagnetic material and disposed around the main pole 15 and the side shields 16C and 16D. An example of the nonmagnetic material used to form the first nonmagnetic layer is an insulating material such as alumina.

The write head unit 9 further includes a nonmagnetic metal layer 58 formed of a nonmagnetic metal material and disposed on a first portion of the top surface 15T of the main pole 15, the first portion being located away from the medium facing surface 80. The nonmagnetic metal layer 58 is formed of Ru, NiCr, or NiCu, for example.

The write head unit 9 further includes a second gap layer 19 formed of a nonmagnetic material. The second gap layer 19 is disposed to cover the main pole 15 and the nonmagnetic metal layer 58. An example of the nonmagnetic material used to form the second gap layer 19 is an insulating material such as alumina.

The write head unit 9 further includes a nonmagnetic layer 60 formed of a nonmagnetic material and disposed on the second gap layer 19. The nonmagnetic layer 60 has an end closest to the medium facing surface 80, the end being located at a distance from the medium facing surface 80. The nonmagnetic layer 60 is formed of alumina, for example.

The trailing shield 16A lies over the side shields 16C and 16D, the second gap layer 19, and the nonmagnetic layer 60, and is in contact with the top surfaces of the side shields 16C and 16D, the second gap layer 19, and the nonmagnetic layer 60. The trailing shield 16A has a front end face located in the medium facing surface 80. In the medium facing surface 80, a portion of the front end face of the trailing shield 16A is spaced from the end face 15a of the main pole 15 by a predetermined distance created by the thickness of the second gap layer 19. The thickness of the second gap layer 19 preferably falls within the range of 5 to 60 nm, and may be 30 to 60 nm, for example. The end face 15a of the main pole 15 has a side adjacent to the second gap layer 19, the side defining the track width.

The upper return path section 40 includes coupling sections 41 and 42. The coupling section 41 lies on a second portion of the top surface 15T of the main pole 15, the second portion being located away from the medium facing surface 80. The second portion of the top surface 15T of the main pole 15 is located farther from the medium facing surface 80 than the first portion of the top surface 15T of the main pole 15.

Although not shown in the drawing, the upper coil portion 20 is wound around the coupling section 41. The write head unit 9 further includes: a first insulating film 61 formed of an insulating material and separating at least part of the upper coil portion 20 from the second gap layer 19, the coupling section 41, the nonmagnetic metal layer 58, and the nonmagnetic layer 60; a second insulating film 62 formed of an insulating material and disposed to cover at least part of the upper coil portion 20 and the first insulating film 61; and a second nonmagnetic layer (not shown) formed of an insulating material and disposed around the trailing shield 16A, the upper coil portion 20, and the coupling section 41. The first and second insulating films 61 and 62 are formed of alumina, for example. An example of the nonmagnetic material used to form the second nonmagnetic layer is an insulating material such as alumina.

The coupling section 42 is disposed on the trailing shield 16A, the coupling section 41, and the second insulating film 62. The coupling section 42 has an end face located in the medium facing surface 80.

The magnetic head 100 further includes a protective layer 70 formed of a nonmagnetic material and disposed to cover the write head unit 9. The protective layer 70 is formed of, for example, an inorganic insulating material such as alumina.

As has been described, the magnetic head 100 according to the present embodiment includes the medium facing surface 80, the read head unit 8, and the write head unit 9. The read head unit 8 and the write head unit 9 are stacked on the substrate 1. The write head unit 9 is located forward relative to the read head unit 8 in the direction of travel of the recording medium 90 (the Z direction).

The write head unit 9 includes the coil including the upper coil portion 20 and the lower coil portion 10, the main pole 15, the write shield 16, the first gap layer 18, and the second gap layer 19. The write shield 16 includes the trailing shield 16A, the leading shield 16B, and the side shields 16C and 16D.

The write head unit 9 further includes the upper return path section 40 and the lower return path section 30. The upper return path section 40 includes the coupling sections 41 and 42. The lower return path section 30 includes the coupling sections 31, 32, 33, and 34.

The write shield 16 captures a disturbance magnetic field applied to the magnetic head 100 from outside the magnetic head 100. This can prevent erroneous writing on the recording medium 90 that would be caused by the disturbance magnetic field being intensively captured into the main pole 15. The write shield 16 further has the function of capturing a magnetic flux that is generated from the end face 15a of the main pole 15 and spreads in directions other than the direction perpendicular to the plane of the recording medium 90, and thereby preventing the magnetic flux from reaching the recording medium 90. Furthermore, the write shield 16, the upper return path section 40, and the lower return path section 30 have the function of allowing a magnetic flux that has been generated from the end face 15a of the main pole 15 and has magnetized a portion of the recording medium 90 to flow back.

Figure 3:
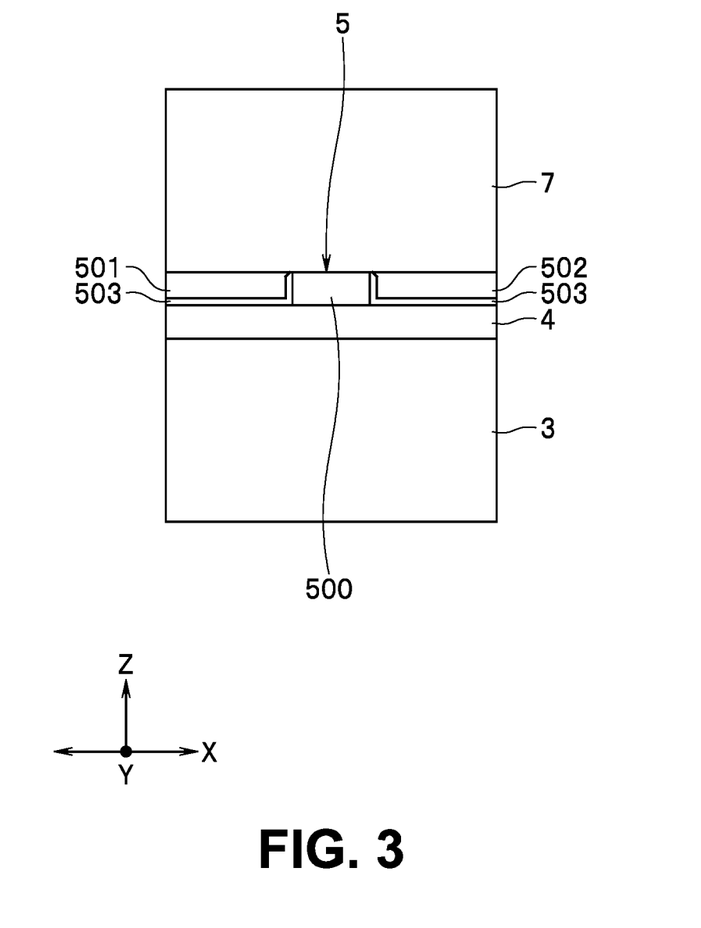
FIG. 3 is a front view showing a magnetoresistive element according to the embodiment of the invention.

Next, the configuration of the MR element 5 will be described with reference to FIG. 3. FIG. 3 is a front view showing the MR element 5.

The MR element 5 includes a stack 500 serving as the main body of the MR element 5, a pair of magnetic layers 501 and 502, and an insulating film 503. The stack 500 includes a plurality of layers stacked in the Z direction, and has a predetermined width (a dimension in the track width direction (X direction)). The magnetic layers 501 and 502 are located on both sides of the stack 500 in the track width direction (X direction). The insulating film 503 is interposed between the stack 500 and the magnetic layer 501 and between the stack 500 and the magnetic layer 502. Each of the magnetic layers 501 and 502 is formed of a layered film including a ferromagnetic layer and an antiferromagnetic layer, for example. The insulating film 503 is formed of MgO, for example.

The insulating layer 6 shown in FIGS. 1 and 2 is located around the stack 500 and the magnetic layers 501 and 502. The second read shield layer 7 shown in FIGS. 1 and 2 is located on the stack 500 and the magnetic layers 501 and 502. The magnetic head further includes a nonmagnetic metal layer 4 interposed between the first read shield layer 3 shown in FIGS. 1 and 2 and the stack 500 and the magnetic layers 501 and 502.

Figure 4:
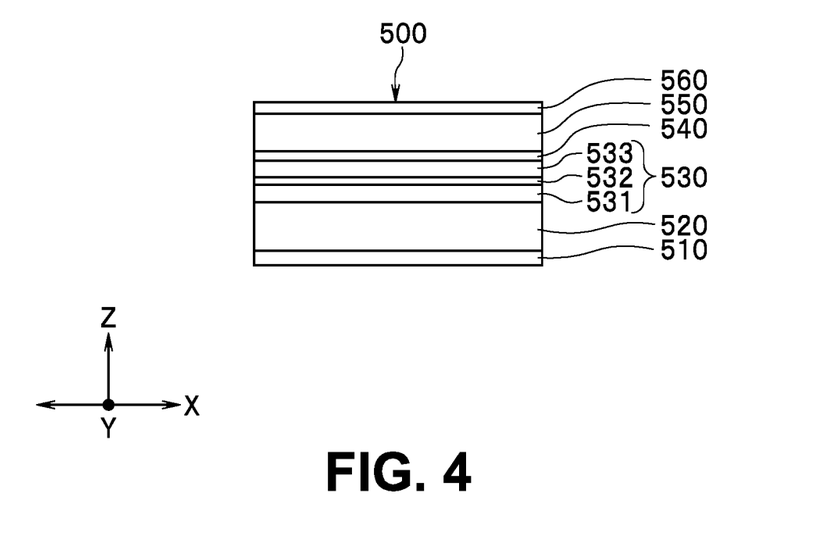
FIG. 4 is a cross-sectional view showing an example of a configuration of a stack in the magnetoresistive element according to the embodiment of the invention.

An example of the configuration of the stack 500 will now be described with reference to FIG. 4. In the example shown in FIG. 4, the stack 500 includes an underlayer 510, a magnetic layer 520, a pinned layer 530, a tunnel barrier layer 540, a free layer 550, and a cap layer 560 stacked in this order on the nonmagnetic metal layer 4. The underlayer 510 and the cap layer 560 are each formed of a nonmagnetic conductive material such as Ru or Ta. The magnetic layer 520 is formed of a magnetic material such as NiFe.

The pinned layer 530 has a magnetization whose direction is fixed. In the example shown in FIG. 4, the pinned layer 530 includes a first magnetic layer 531, a second magnetic layer 533, and a nonmagnetic layer 532 disposed between the first magnetic layer 531 and the second magnetic layer 533, and has a so-called synthetic structure. The free layer 550 is a ferromagnetic layer whose magnetization direction varies depending on a signal magnetic field.

A manufacturing method for the magnetic head 100 according to the embodiment will be outlined below. The manufacturing method for the magnetic head 100 according to the embodiment fabricates a substructure by forming components of a plurality of magnetic heads 100, except the substrates 1, on a single wafer that includes portions to become the substrates 1 of the plurality of magnetic heads 100. The substructure includes pre-slider portions arranged in rows, the pre-slider portions becoming individual sliders later. Next, the substructure is cut into a slider assemblage that includes a row of pre-slider portions. The slider assemblage is then subjected to polishing on a surface thereof resulting from cutting the substructure, whereby the medium facing surface 80 is formed for each pre-slider portion included in the slider assemblage. Then, the slider assemblage is cut to separate the plurality of pre-slider portions from each other. This produces a plurality of sliders including respective magnetic heads 100.

Now, with attention focused on a single magnetic head 100, the manufacturing method for the magnetic head 100 will be described briefly. The manufacturing method for the magnetic head 100 starts with forming the insulating layer 2 on the substrate 1. The read head unit 8 is then formed on the insulating layer 2. Then, the nonmagnetic layer 71, the middle shield layer 72, and the nonmagnetic layer 73 are formed in this order on the read head unit 8. The write head unit 9 is then formed on the nonmagnetic layer 73. Then, the protective layer 70 is formed to cover the write head unit 9. Wiring and other components are then formed on the top surface of the protective layer 70. When the substructure is thus completed, the substructure is cut and the surface to become the medium facing surface 80 is polished into the medium facing surface 80 as described above. The slider including the magnetic head 100 is thereby completed.

Next, a manufacturing method for the MR element 5 according to the present embodiment will be described with reference to FIGS. 5 to 12. FIGS. 5 to 12 each show a stack of layers formed in the process of manufacturing the magnetic head 100. FIGS. 5 to 12 omit the illustration of portions that are closer to the substrate 1 relative to the first read shield layer 3. FIGS. 5 to 12 each show a cross section of the stack taken at the position where the medium facing surface 80 is to be formed.

Figure 5:
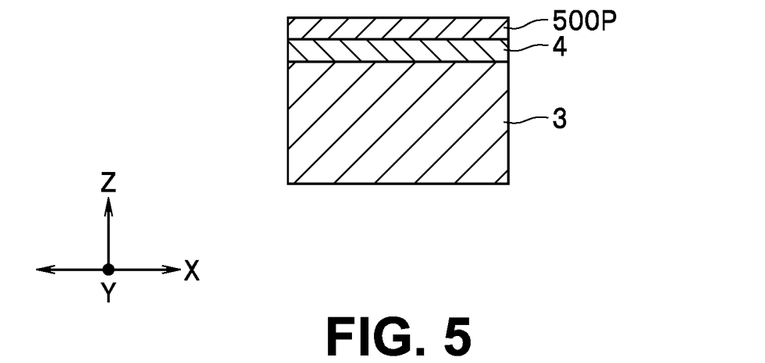
FIG. 5 is a cross-sectional view showing a step of a manufacturing method for the magnetoresistive element according to the embodiment of the invention.

FIG. 5 shows the step after the formation of the insulating layer 2 (see FIGS. 1 and 2). In this step, the first read shield layer 3 and the nonmagnetic metal layer 4 are initially formed on the insulating layer 2 in this order. Next, a layered film 500P, which later becomes the stack 500, is formed on the nonmagnetic metal layer 4. The layered film 500P includes the plurality of layers shown in FIG. 4, for example.

Figure 6:
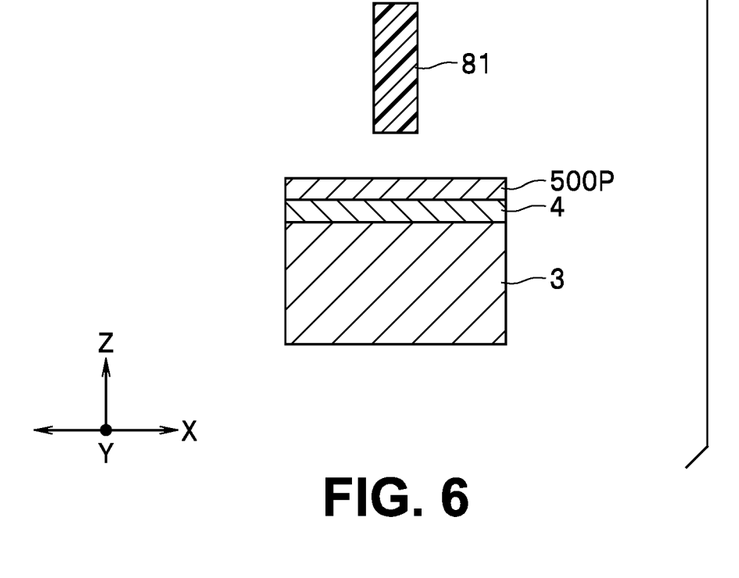
FIG. 6 is a cross-sectional view showing a step that follows the step shown in FIG. 5.

FIG. 6 shows the next step. In this step, an etching mask 81 is formed on the layered film 500P. The etching mask 81 has an undercut. The etching mask 81 includes, for example, a lower layer lying on the layered film 500P and an upper layer lying on the lower layer. The upper layer is formed of a photoresist patterned by photolithography. The lower layer is formed of, for example, a material that dissolves in a developing solution used in patterning the upper layer.

When the upper layer is patterned, a portion of the lower layer interposed between the layered film 500P and the upper layer near the position where the medium facing surface 80 is to be formed is removed. As a result, as shown in FIG. 6, a gap is formed between the layered film 500P and the etching mask 81 near the position where the medium facing surface 80 is to be formed. Note that even if the foregoing portion of the lower layer is removed, the etching mask 81 will not peel away since the lower layer remains between the layered film 500P and the upper layer except in the vicinity of the position where the medium facing surface 80 is to be formed.

Figure 7:
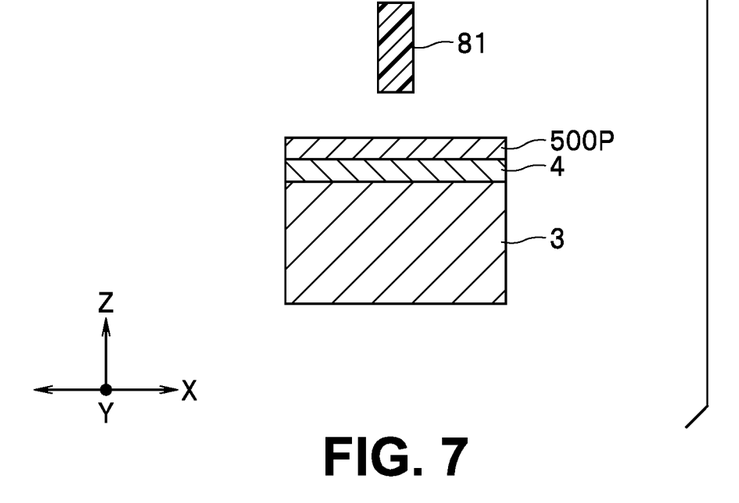
FIG. 7 is a cross-sectional view showing a step that follows the step shown in FIG. 6.

FIG. 7 shows the next step. In this step, the width (a dimension in the track width direction (X direction)) of the etching mask 81 is reduced by ashing using an ashing gas containing 02 or by reactive ion etching (hereinafter, referred to as RIE), for example. After this step, the width of the etching mask 81 near the position where the medium facing surface 80 is to be formed falls within the range of 30 to 40 nm, for example.

Figure 8:
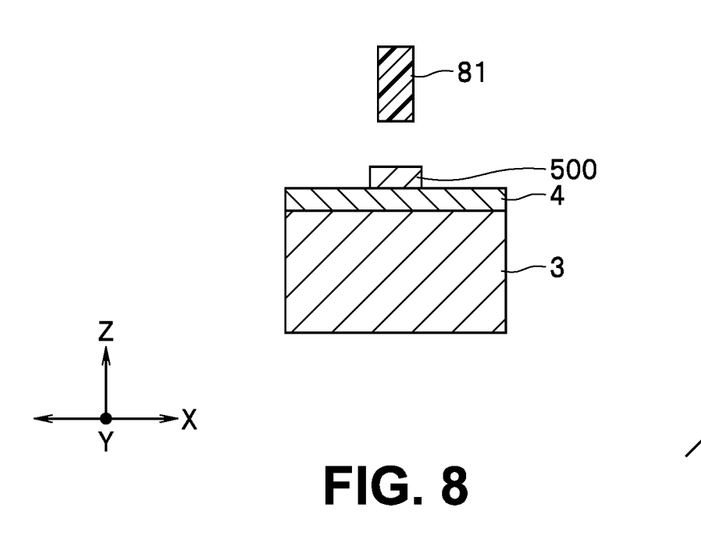
FIG. 8 is a cross-sectional view showing a step that follows the step shown in FIG. 7.

FIG. 8 shows the next step. In this step, the stack 500 is formed by etching the layered film 500P using the etching mask 81. The layered film 500P is etched using ion beam etching (hereinafter, referred to as IBE), for example. In using IBE, the layered film 500P may be etched by combining IBE under a first condition and IBE under a second condition. As employed herein, the angle that the direction of travel of the ion beam forms with a direction parallel to the Z direction will be referred to as an incident angle. In the IBE under the first condition, the incident angle of the ion beam is set to 0° or approximately 0°. In other words, for the IBE under the first condition, the direction of travel of the ion beam is perpendicular or substantially perpendicular to the layered film 500P. The IBE under the second condition is performed after the IBE under the first condition. In the IBE under the second condition, the incident angle of the ion beam is set to approximately 90°. In other words, for the IBE under the second condition, the direction of travel of the ion beam is substantially parallel to the layered film 500P.

Figure 9:
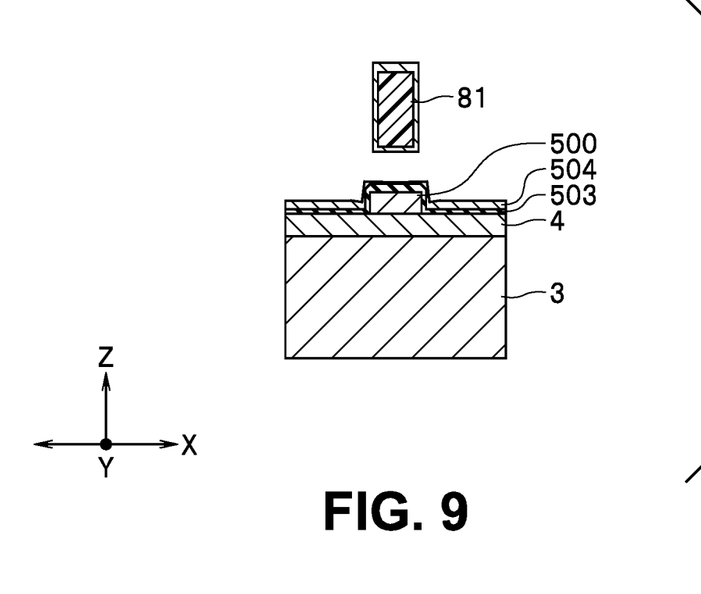
FIG. 9 is a cross-sectional view showing a step that follows the step shown in FIG. 8.

FIG. 9 shows the next step. In this step, the insulating film 503 is initially formed to cover the stack 500 with the etching mask 81 left unremoved. An initial magnetic layer 504, which later becomes a part of each of the pair of magnetic layers 501 and 502, is then formed to cover the insulating film 503. The initial magnetic layer 504 may be formed of a layered film including a ferromagnetic layer and an antiferromagnetic layer. The etching mask 81 is then removed.

In the example shown in FIG. 9, the insulating film 503 and the initial magnetic layer 504 are formed before the removal of the etching mask 81. However, the insulating film 503 and the initial magnetic layer 504 may be formed after the removal of the etching mask 81.

Figure 10:
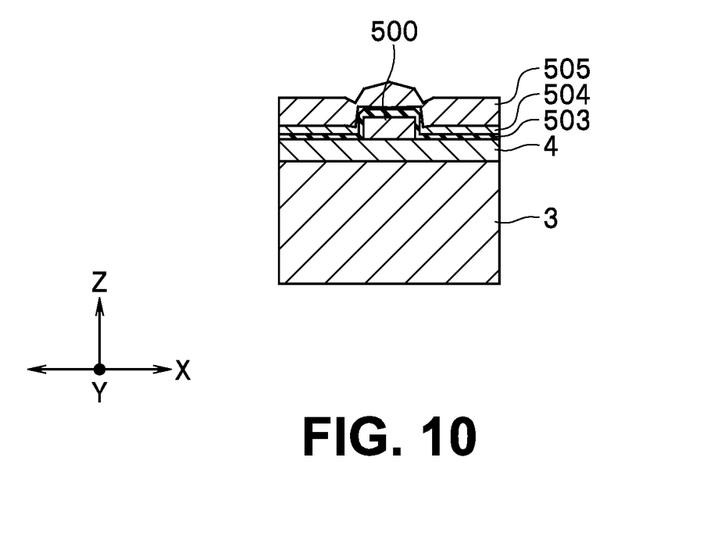
FIG. 10 is a cross-sectional view showing a step that follows the step shown in FIG. 9.

FIG. 10 shows the next step. In this step, an initial magnetic layer 505, which later becomes another part of each of the pair of magnetic layers 501 and 502, is formed to cover the initial magnetic layer 504. The initial magnetic layers 504 and 505 are formed to cover the stack 500 and the insulating film 503 so that a total thickness of the initial magnetic layers 504 and 505 in the Z direction is greater than the thickness of the stack 500 in the Z direction. As shown in FIG. 10, the top surface of the initial magnetic layer 505 has a relatively large difference in surface level near the stack 500, or specifically, in front of the stack 500 in the Z direction.

Figure 11:
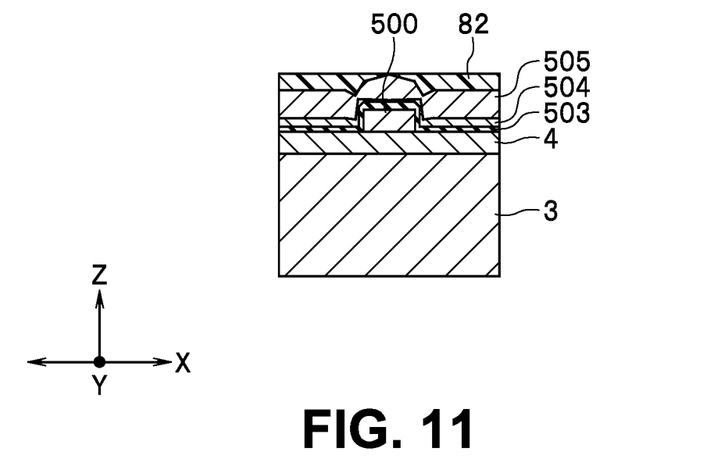
FIG. 11 is a cross-sectional view showing a step that follows the step shown in FIG. 10.

FIG. 11 shows the next step. In this step, an organic material film 82 is formed on the initial magnetic layer 505. Specifically, an organic material such as a fluid resist is initially applied to the initial magnetic layer 505. The organic material is then heated to cure. The heating temperature is 150° C. or higher, for example. In an example, the heating temperature is 180° C. The organic material film 82 is completed by the curing of the organic material.

The organic material is applied so that the maximum thickness of the organic material in the Z direction is greater than the differences in surface level (differences in level at the top surface) of the initial magnetic layer 505 in the Z direction. The organic material being as thin as possible while satisfying the foregoing condition is desirable. For example, if the initial magnetic layer 505 has a difference of 30 nm in surface level, the thickness of the organic material is set to 35 nm.

Figure 12:
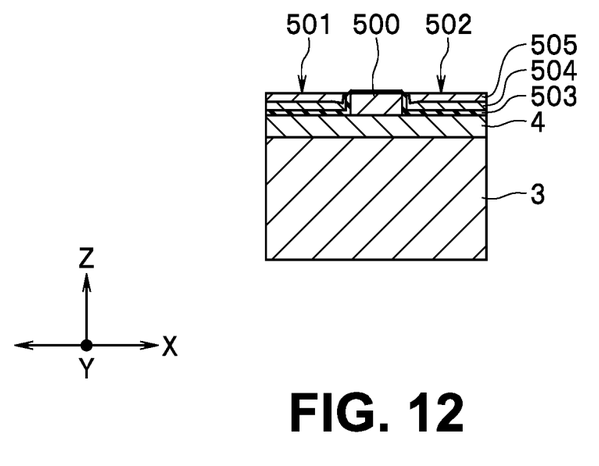
FIG. 12 is a cross-sectional view showing a step that follows the step shown in FIG. 11.

FIG. 12 shows the next step. In this step, a part of each of the initial magnetic layers 504 and 505 and the organic material film 82 are etched by IBE so that the initial magnetic layers 504 and 505 become the pair of magnetic layers 501 and 502. This etching step is performed under the condition that the etching rate (removal rate) of the initial magnetic layers 504 and 505 is the same or substantially the same as that of the organic material film 82. Specifically, the incident angle of the ion beam is set within the range of 30° to 40°, for example. In an example, the incident angle is 35°. If the insulating film 503 is formed of MgO, the etching step may be stopped when the insulating film 503 is exposed and scattered MgO is detected. Alternatively, an etching stop layer may be formed aside from the insulating film 503. In such a case, the etching step may be stopped when the etching stop layer is exposed and the substance constituting the etching stop layer is detected.

In the manufacturing method for the magnetic head 100 according to the present embodiment, the step shown in FIG. 12 is followed by the following steps up to the formation of the second read shield layer 7, for example. A part of the insulating film 503 is initially etched to expose the top surface of the stack 500. The insulating layer 6 (see FIGS. 1 and 2) is then formed around the stack 500 and the pair of magnetic layers 501 and 502. The second read shield layer 7 (FIGS. 1 and 2) is then formed on the stack 500 and the pair of magnetic layers 501 and 502.

As described above, the manufacturing method for the MR element 5 according to the present embodiment includes the following steps: the step of forming the stack 500; the step of forming the insulating film 503 to cover the stack 500; the step of forming the initial magnetic layers 504 and 505 to cover the stack 500 and the insulating film 503 so that the total thickness of the initial magnetic layers 504 and 505 in the Z direction is greater than that of the stack 500 in the Z direction; the step of forming the organic material film 82 on the initial magnetic layers 504 and 505; and the etching step of etching a part of the initial magnetic layers 504 and 505 and the organic magnetic film 82 by IBE so that the initial magnetic layers 504 and 505 become the pair of magnetic layers 501 and 502. The step of forming the organic material film 82 includes the step of applying the fluid organic material and the step of heating the organic material to cure.

In the present embodiment, a part of each of the initial magnetic layers 504 and 505 and the organic material film 82 are etched by IBE. According to the present embodiment, the top surfaces of the pair of magnetic layers 501 and 502 can thus be accurately made even with each other. This effect will now be described in comparison with a manufacturing method for an MR element according to a comparative example.

Figure 13:
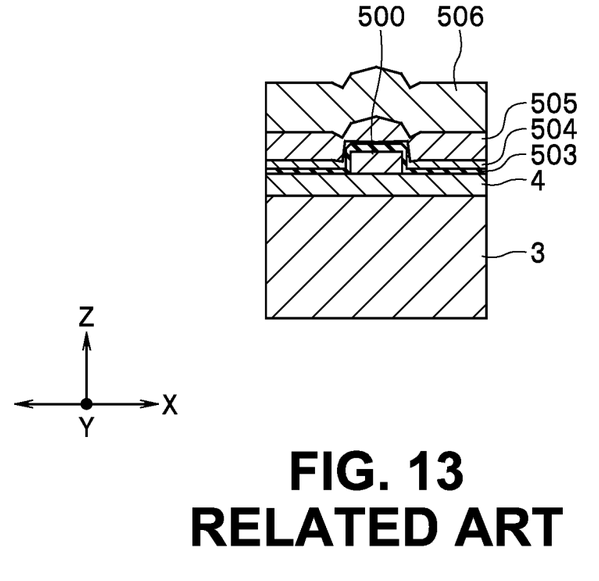
FIG. 13 is a cross-sectional view showing a step of a manufacturing method for the magnetoresistive element of a comparative example.
Figure 14:
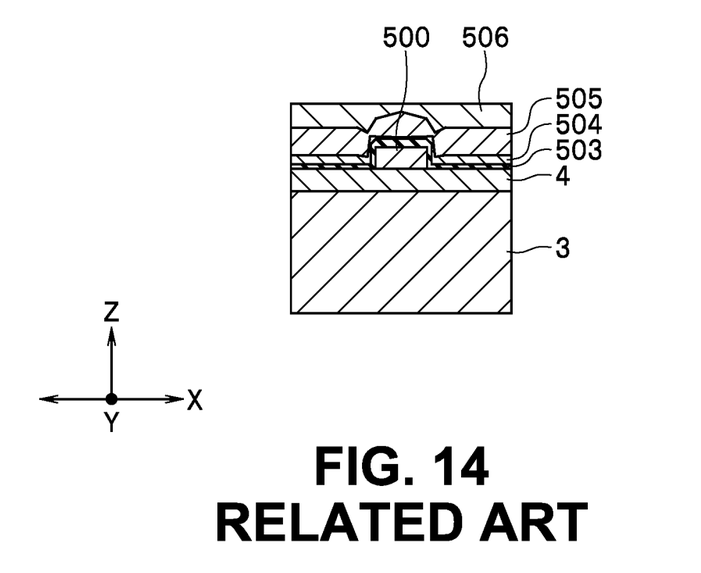
FIG. 14 is a cross-sectional view showing a step that follows the step shown in FIG. 13.

FIGS. 13 and 14 show a stack in the process of manufacturing a magnetic head 100 to which the manufacturing method for the MR element according to the comparative example is applied. FIGS. 13 and 14 omit the illustration of portions that are closer to the substrate 1 relative to the first read shield layer 3. FIGS. 13 and 14 each show a cross section of the stack taken at the position where the medium facing surface 80 is to be formed.

The manufacturing method for the MR element according to the comparative example is the same as the manufacturing method for the MR element 5 according to the present embodiment up to the step of forming the initial magnetic layer 505. FIG. 13 shows the next step. In this step, a magnetic layer 506 formed of a magnetic material such as NiFe is formed on the initial magnetic layer 505. The magnetic layer 506 is formed so that the thickness of the magnetic layer 506 in the Z direction is greater than a difference in surface level of the initial magnetic layer 505 in the Z direction. For example, if the initial magnetic layer 505 has a difference of 30 nm in surface level, the thickness of the magnetic layer 506 is set to 60 nm. As shown in FIG. 13, the top surface of the magnetic layer 506 also has a difference in surface level.

FIG. 14 shows the next step. In this step, the top surface of the magnetic layer 506 is planarized by chemical mechanical polishing (hereinafter, referred to as CMP), for example.

In the manufacturing method for the MR element according to the comparative example, a part of each of the initial magnetic layers 504 and 505 and the magnetic layer 506 are then etched by IBE so that the initial magnetic layers 504 and 505 become the pair of magnetic layers 501 and 502.

In general, variations in the thickness of a layer polished by CMP are greater than variations in the thickness of a layer etched by IBE. For example, variations in the thickness of the layer polished by CMP are approximately 10% of the amount of polishing. Variations in the thickness of the layer etched by IBE are approximately 1% of the amount of etching. The manufacturing method for the MR element according to the comparative example therefore causes relatively large variations in the thicknesses of the magnetic layers 501 and 502 due to the CMP polishing step.

By contrast, according to the present embodiment, the CMP polishing step can be omitted. According to the present embodiment, the top surfaces of the pair of magnetic layers 501 and 502 can thus be accurately made even with each other compared to the manufacturing method for the MR element according to the comparative example.

Figure 15:
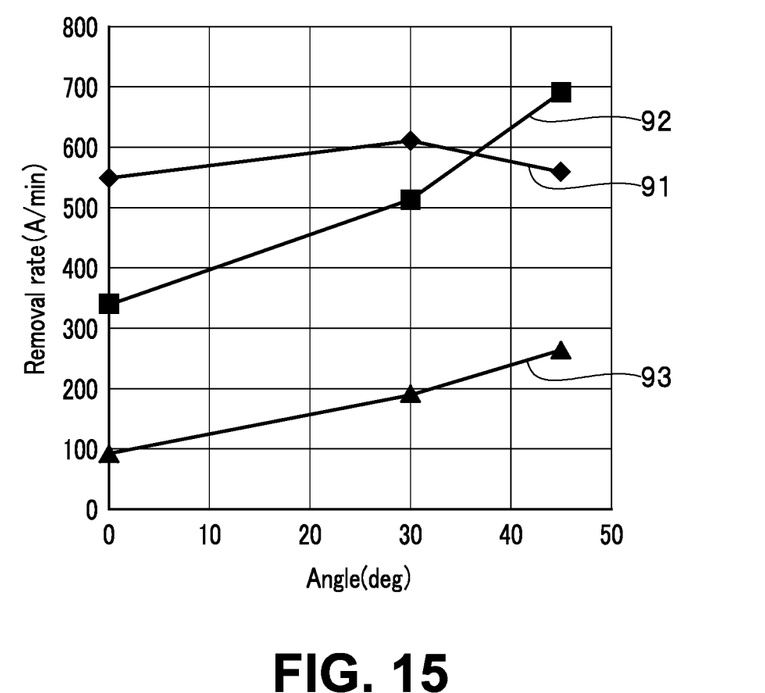
FIG. 15 is a characteristic chart showing a relationship between an incident angle of an ion beam in ion beam etching and a removal rate.

Now, a relationship between the incident angle of the ion beam in IBE and the removal rate will be described with reference to FIG. 15. FIG. 15 is a characteristic chart showing the relationship between the incident angle and the removal rate. In FIG. 15, the horizontal axis indicates the incident angle, and the vertical axis indicates the removal rate (in units of Å/min). In FIG. 15, the reference numeral 91 denotes the removal rate of NiFe that is a magnetic substance, the reference numeral 92 the removal rate of the cured resist, and the reference numeral 93 the removal rate of carbon. FIG. 15 shows that the removal rate of the resist increases as the incident angle increases from 0°. It can be seen from FIG. 15 that if the incident angle is 30° to 40°, a difference between the removal rate of the resist and that of NiFe is smaller than at an incident angle of 0°. It can also be seen that if the incident angle is 35°, the removal rate of the resist coincides with that of the NiFe. In the present embodiment, a part of each of the initial magnetic layers 504 and 505 and the organic material film 82 are etched under the etching condition that reduces the difference between the removal rates of the resist and NiFe. According to the present embodiment, the top surfaces of the pair of magnetic layers 501 and 502 can be accurately made even with each other by planarizing differences in surface levels of the initial magnetic layers 504 and 505.

The present invention is not limited to the foregoing embodiment, and various modifications may be made thereto. For example, the configuration of the pair of magnetic layers 501 and 502 is not limited to the example described in the embodiment and may be optional as long as the requirements set forth in the claims are satisfied.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiment.

What is claimed is:

1. A manufacturing method for a magnetoresistive element, the magnetoresistive element including:
a stack that serves as a main body of the magnetoresistive element, the stack including a plurality of layers stacked in a first direction and having a predetermined width;
a pair of magnetic layers located on both sides of the stack in a second direction orthogonal to the first direction; and an insulating film interposed between the stack and the pair of magnetic layers, the manufacturing method comprising:

a step of forming the stack;

a step of forming the insulating film to cover the stack;

a step of forming an initial magnetic layer to cover the stack and the insulating film so that a thickness of the initial magnetic layer in the first direction is greater than a thickness of the stack in the first direction;

a step of forming an organic material film on the initial magnetic layer; and an etching step of etching a part of the initial magnetic layer and the organic material film by ion beam etching so that the initial magnetic layer becomes the pair of magnetic layers.

2. The manufacturing method for a magnetoresistive element according to claim 1, wherein the step of forming the organic material film includes a step of applying a fluid organic material, and a step of heating the organic material to cure.

3. The manufacturing method for a magnetoresistive element according to claim 2, wherein a maximum thickness of the organic material in the first direction is greater than a difference in surface level of the initial magnetic layer in the first direction, and the initial magnetic layer has the difference in surface level near the stack.

4. The manufacturing method for a magnetoresistive element according to claim 1, wherein an angle that a direction of travel of an ion beam forms with the first direction in the etching step falls within a range of 30° to 40°.

5. The manufacturing method for a magnetoresistive element according to claim 1, wherein the stack includes a free layer, a pinned layer, and a tunnel barrier layer located between the free layer and the pinned layer.

6. The manufacturing method for a magnetoresistive element according to claim 1, wherein the insulating film is formed of MgO.

7. The manufacturing method for a magnetoresistive element according to claim 1, wherein the magnetoresistive element is provided in a magnetic head for perpendicular magnetic recording.

* * * * *